United States Patent
Noh

(10) Patent No.: US 12,322,437 B2
(45) Date of Patent: Jun. 3, 2025

(54) MEMORY CHIP AND MEMORY SYSTEM INCLUDING THE SAME

(71) Applicant: Samsung Electronics Co., Ltd., Suwon-si (KR)

(72) Inventor: Kwangsook Noh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 220 days.

(21) Appl. No.: 18/189,756

(22) Filed: Mar. 24, 2023

(65) Prior Publication Data

US 2023/0420039 A1 Dec. 28, 2023

(30) Foreign Application Priority Data

Jun. 23, 2022 (KR) .................. 10-2022-0076632

(51) Int. Cl.
*G11C 11/408* (2006.01)
*G11C 11/4093* (2006.01)
*G11C 11/4096* (2006.01)
*G11C 11/00* (2006.01)

(52) U.S. Cl.
CPC ...... *G11C 11/4096* (2013.01); *G11C 11/4087* (2013.01); *G11C 11/4093* (2013.01); *G11C 11/005* (2013.01); *G11C 11/408* (2013.01)

(58) Field of Classification Search
CPC ............ G11C 11/4096; G11C 11/4087; G11C 11/4093; G11C 11/005; G11C 11/408; G11C 13/0004; G11C 13/0023; G11C 7/1042; G11C 7/1045; G11C 8/12
USPC ........................................................ 365/191
See application file for complete search history.

(56) References Cited

U.S. PATENT DOCUMENTS

| | | |
|---|---|---|
| 8,635,418 B2 | 1/2014 | Frank |
| 8,812,886 B2 | 8/2014 | Ahn et al. |
| 8,972,822 B2 | 3/2015 | Nakano et al. |
| 10,878,887 B2 | 12/2020 | Ware et al. |
| 11,042,490 B2 | 6/2021 | Morgan et al. |
| 11,216,596 B2 | 1/2022 | Bae |
| 2001/0052049 A1* | 12/2001 | Kuo ............ G11C 16/08 711/173 |

(Continued)

FOREIGN PATENT DOCUMENTS

| | | |
|---|---|---|
| KR | 10-2010-0083626 A | 7/2010 |
| KR | 10-1430087 A | 6/2013 |

*Primary Examiner* — Ly D Pham
(74) *Attorney, Agent, or Firm* — HARNESS, DICKEY & PIERCE, P.L.C.

(57) ABSTRACT

A memory chip includes a plurality of storage blocks respectively including a plurality of memory cells; and a logic circuit configured to control the plurality of storage blocks, wherein the logic circuit includes an input/output pad configured to input data to the plurality of storage blocks and output data to the plurality of storage blocks; wherein the logic circuit is further configured to allocate block address codes having a bit inversion relationship with each other, output a mode selection signal in response to external control, output an external address code in response to the mode selection signal indicating a first addressing mode, and output an address code having a bit inversion relationship with regard to the external address code in response to the mode selection signal indicating a second addressing mode, and select a storage block to be controlled by the access command from among the plurality of storage blocks.

8 Claims, 13 Drawing Sheets

(56) References Cited

U.S. PATENT DOCUMENTS

| | | |
|---|---|---|
| 2010/0177584 A1 | 7/2010 | Lee et al. |
| 2014/0078840 A1* | 3/2014 | Seo .......................... G11C 7/10 |
| | | 365/194 |
| 2017/0337144 A1 | 11/2017 | Ware et al. |
| 2018/0040362 A1* | 2/2018 | Kwak ................. G11C 11/4074 |
| 2021/0098064 A1* | 4/2021 | Lee .................... G11C 13/0028 |
| 2021/0174860 A1* | 6/2021 | Song ..................... G11C 11/419 |

\* cited by examiner

Physical distance

| Block | I/O PAD | MODE1 | MODE2 |
|-------|---------|-------|-------|
| 1 | Short | 000 | 111 |
| 2 |  | 001 | 110 |
| 3 |  | 010 | 101 |
| 4 |  | 011 | 100 |
| 5 |  | 100 | 011 |
| 6 |  | 101 | 010 |
| 7 |  | 110 | 001 |
| 8 | Long | 111 | 000 |

Pairing

FIG. 4A

| Block | Current (mA) | MODE1 | MODE2 |
|-------|--------------|-------|-------|
| 1 | 90 | 000 | 111 |
| 2 | 95 | 001 | 110 |
| 3 | 100 | 010 | 101 |
| 4 | 105 | 011 | 100 |
| 5 | 110 | 100 | 011 |
| 6 | 115 | 101 | 010 |
| 7 | 120 | 110 | 001 |
| 8 | 125 | 111 | 000 |

Pairing

FIG. 4B

| Block | MODE1 | MODE2 | MODE1 | MODE2 | MODE1 | MODE2 |
|---|---|---|---|---|---|---|
| 1 | 0 0 0 | 0 0 1 | 0 0 0 | 0 1 0 | 0 0 0 | 1 0 0 |
| 2 | 0 1 0 | 0 1 1 | 0 0 1 | 0 1 1 | 0 0 1 | 1 0 1 |
| 3 | 1 0 0 | 1 0 1 | 1 0 0 | 1 1 0 | 0 1 0 | 1 1 0 |
| 4 | 1 1 0 | 1 1 1 | 1 0 1 | 1 1 1 | 0 1 1 | 1 1 1 |
| 5 | 1 1 1 | 1 1 0 | 1 1 1 | 1 0 1 | 1 1 1 | 0 1 1 |
| 6 | 1 0 1 | 1 0 0 | 1 1 0 | 1 0 0 | 1 1 0 | 0 1 0 |
| 7 | 0 1 1 | 0 1 0 | 0 1 1 | 0 0 1 | 1 0 1 | 0 0 1 |
| 8 | 0 0 1 | 0 0 0 | 0 1 0 | 0 0 0 | 1 0 0 | 0 0 0 |

ONLY A[0] IS INVERTED    ONLY A[1] IS INVERTED    ONLY A[2] IS INVERTED

FIG. 9

: MODE1 selected

: MODE2 selected

MEMORY CHIP AND MEMORY SYSTEM INCLUDING THE SAME

CROSS-REFERENCE TO RELATED APPLICATION(S)

This application claims benefit of priority to Korean Patent Application No. 10-2022-0076632 filed on Jun. 23, 2022 in the Korean Intellectual Property Office, the disclosure of which is incorporated herein by reference in its entirety.

BACKGROUND

The present inventive concepts relate to a memory chip and a memory system including the memory chip.

A semiconductor memory chip may include a plurality of memory cells. The plurality of memory cells may be connected to word lines and bit lines. A memory cell may include a capacitor storing charges, and a transistor accessing the capacitor to change or sense the charges. A read operation in the memory chip may be performed by activating a word line, connecting memory cells corresponding to the word line to a bit line, and detecting data in the bit line.

In order to improve an access speed of the memory chip, a bank structure may be adopted to reduce a capacitance load of the word line by reducing a length of the word line. That is, memory cells may include a plurality of banks, and a logic circuit of a memory chip may operate the memory cells in units of banks. Meanwhile, operating current magnitudes generated when each of the plurality of banks is accessed may vary according to a distance between the plurality of banks and the logic circuit.

SUMMARY

Example embodiments of the present inventive concepts reduce a maximum magnitude of a peak current generated when a plurality of memory chips are simultaneously operated in a memory system including the plurality of memory chips.

According to an example embodiment of the present inventive concepts, a memory chip includes a plurality of storage blocks respectively including a plurality of memory cells; and a logic circuit configured to control the plurality of storage blocks, wherein the logic circuit includes an input/output pad configured to input data to the plurality of storage blocks and output data to the plurality of storage blocks, wherein the logic circuit is further configured to allocate block address codes having a bit inversion relationship with each other, to a storage block having a $k^{th}$ longest distance from the input/output pad among the plurality of storage blocks and a storage block having a $k^{th}$ shortest distance from the input/output pad among the plurality of storage blocks, where k is a natural number, output a mode selection signal in response to external control output an external address code received together with an access command in response to the mode selection signal indicating a first addressing mode, output an first address code having a bit inversion relationship with regard to the external address code in response to the mode selection signal indicating a second addressing mode, and select a storage block to be controlled by the access command from among the plurality of storage blocks, based on the external address code or the first address code.

According to an example embodiment of the present inventive concepts, a memory chip includes a plurality of storage blocks each including a plurality of memory cells; and a logic circuit configured to pair a pair of storage blocks among the plurality of storage blocks, the pair of storage blocks including a storage block having a $k^{th}$ highest operating current among the plurality of storage blocks and a storage block having a $k^{th}$ lowest operating current among the plurality of storage blocks, where k is a natural number, and allocate respective block address codes having a bit inversion relationship with each other to the paired storage blocks, and control the plurality of storage blocks using an external address code or using a first address code having the bit inversion relationship with regard to the external address code, according to an addressing mode.

According to an example embodiment of the present inventive concepts, a memory system includes a plurality of memory chips including a plurality of storage blocks, each of the plurality of memory chips configured to support a first addressing mode using a plurality of address codes allocated in order of operating current magnitudes of the plurality of storage blocks, and a second addressing mode in which the plurality of address codes are allocated in a reverse order of the operating current magnitudes of the plurality of storage blocks; and a processor configured to determine partial memory chips of the plurality of memory chips as first memory chips operating in the first addressing mode, and determine remaining memory chips of the plurality of memory chips as second memory chips operating in the second addressing mode, and provide an access command and a common address code to the first memory chips and the second memory chips.

BRIEF DESCRIPTION OF DRAWINGS

The above and other aspects, features, and advantages of the present inventive concepts will be more clearly understood from the following detailed description, taken in conjunction with the accompanying drawings, in which:

FIGS. 4A and 4B are views illustrating a block address allocation method according to some example embodiments.

FIG. 9 is a view illustrating a block address allocation method according to some example embodiments.

DETAILED DESCRIPTION

Hereinafter, some example embodiments will be described with reference to the accompanying drawings.

Figure 1:
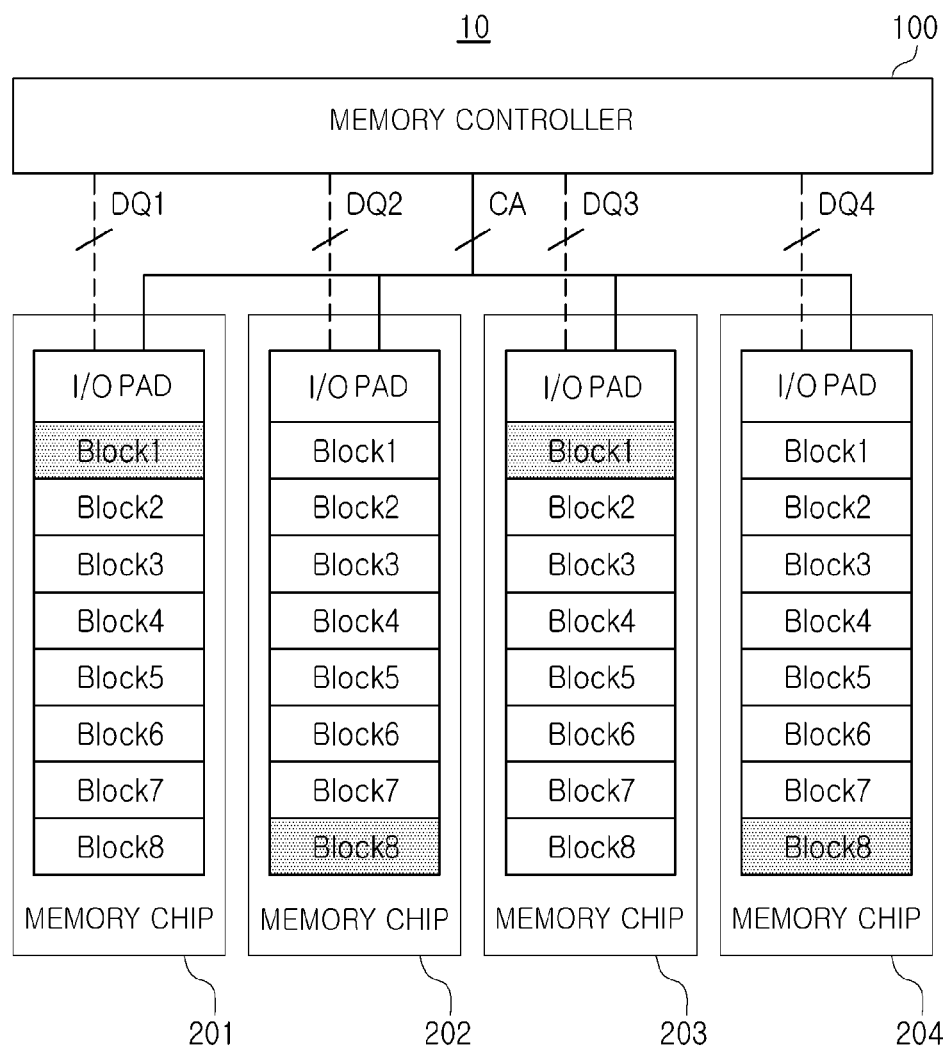
FIG. 1 is a block diagram illustrating a memory system according to some example embodiments.

FIG. 1 is a block diagram illustrating a memory system according to some example embodiments.

Referring to FIG. 1, a memory system 10 may include a memory controller 100 and a plurality of memory chips 201 to 204.

Each of (or alternatively, at least one of) the plurality of memory chips 201 to 204 may be one of various types of memories, such as a dynamic random access memory (DRAM), a phase change random access memory (PCRAM), and the like.

The memory controller 100 may control operations of the plurality of memory chips 201 to 204. The memory controller 100 may exchange data with the plurality of memory chips 201 to 204 through data buses DQ1 to DQ4. In addition, the memory controller 100 may provide a command or an address to the plurality of memory chips 201 to 204 through a command/address bus CA.

The plurality of memory chips 201 to 204 may include a memory module, a memory package, and the like. The memory controller 100 may provide a common command and a common address to the plurality of memory chips 201 to 204. The plurality of memory chips 201 to 204 may respectively access a storage area indicated by a common address in response to the common command, and may simultaneously receive or output data through the data buses DQ1 to DQ4. For example, when the memory system 10 includes four memory chips 201 to 204 and each of (or alternatively, at least one of) the data buses DQ1 to DQ4 has an 8-bit width, 32-bit data may be input or output in one clock cycle. Memory chips capable of simultaneously receiving or outputting data through the data buses DQ1 to DQ4 may be referred to as a memory rank.

Each of (or alternatively, at least one of) the plurality of memory chips 201 to 204 may include storage blocks Block1 to Block8 and an input/output pad. Each of (or alternatively, at least one of) the storage blocks Block1 to Block8 may include memory cells capable of storing data. The input/output pad may provide data received through a data bus to the storage blocks Block1 to Block8, or may output data output from the storage blocks Block1 to Block8 externally through the data bus.

The storage blocks Block1 to Block8 may have different operating characteristics according to a physical distance from the input/output pad. Examples of the operating characteristics may include operating currents such as a driving burst write current IDD4W, a driving burst read current IDD4R, or the like. As the physical distance between the input/output pad and a storage block among the storage blocks is short, a magnitude of an operating current of the storage block may be small, and as the physical distance is long, a magnitude of an operating current of the storage block may be large.

FIG. 1 illustrates the storage blocks Block1 to Block8 according to order of physical distances from the input/output pads. In an example of FIG. 1, a magnitude of an operating current of a first storage block Block1 may be the smallest, and a magnitude of an operating current of an eighth storage block Block8 may be the largest.

When address codes are allocated to the storage blocks in each of (or alternatively, at least one of) the plurality of memory chips 201 to 204 in the same manner, a common location may be accessed in the plurality of memory chips 201 to 204 based on a common address code from the memory controller 100. The common address code may include a block address code for identifying the storage blocks Block1 to Block8.

When storage blocks at a common location are accessed in the plurality of memory chips 201 to 204 based on the common address code, a magnitude of an overall peak current of the memory system 10 may increase. For example, when the plurality of memory chips 201 to 204 collectively access the eighth storage block Block8, a maximum or high operating current may be generated in each memory chip, such that a maximum magnitude of a peak current of the memory system 10 may increase. An increase in peak current may cause occurrence of electromagnetic interference (EMI) or occurrence of jitter of a clock signal, to deteriorate performance and reliability of the memory system 10.

According to some example embodiments, each of (or alternatively, at least one of) the plurality of memory chips 201 to 204 may allocate block address codes having a bit inversion relationship to a storage block having a $k^{th}$ longest distance from the input/output pad and a storage block having a $k^{th}$ shortest distance from the input/output pad (where k is a natural number). In addition, each of (or alternatively, at least one of) the plurality of memory chips 201 to 204 may access a storage block using a block address code included in the common address code as it is in a first addressing mode, and may access a storage block using an address code having a bit inversion relationship of the block address code in a second addressing mode.

The memory controller 100 may control a portion of the plurality of memory chips 201 to 204 to operate in the first addressing mode and a remaining portion thereof to operate in the second addressing mode, to prevent or hinder development of a situation in which only storage blocks having a relatively high operating current are accessed at the same time in the plurality of memory chips 201 to 204. In an example of FIG. 1, when the eighth storage block Block8 having the highest operating current is selected in the memory chips 202 and 204 by a common address, the first storage block Block1 having the lowest operating current may be selected.

According to some example embodiments, since a situation in which only storage blocks having a relatively high operating current are accessed at the same time in the plurality of memory chips 201 to 204 may be prevented or hindered, a magnitude of a peak current of the memory system 10 may be reduced. Therefore, performance and reliability of the memory system 10 may be improved.

Figure 2:
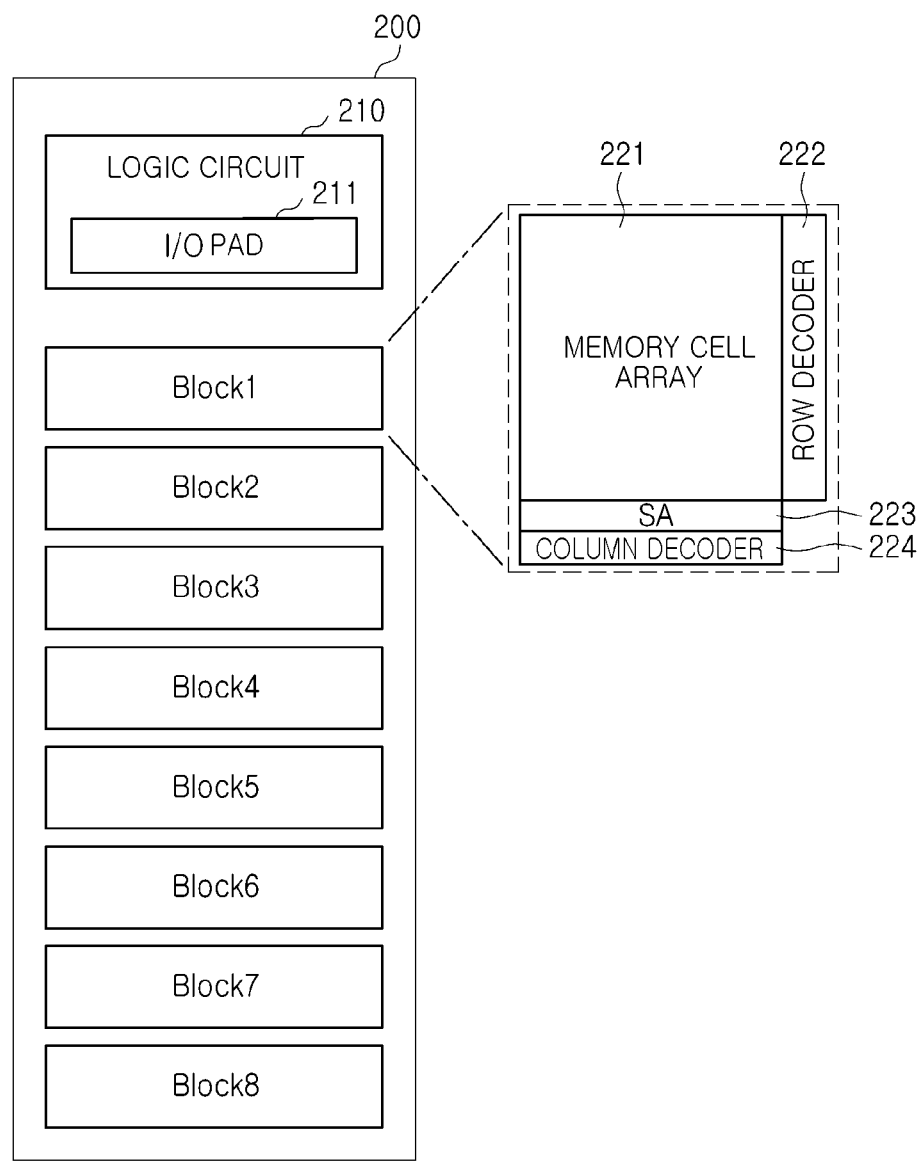
FIG. 2 is a block diagram illustrating a memory chip according to some example embodiments.

FIG. 2 is a block diagram illustrating a memory chip according to some example embodiments.

Referring to FIG. 2, a memory chip 200 may include a logic circuit 210 and storage blocks Block1 to Block8. The memory chip 200 of FIG. 2 may correspond to any of the plurality of memory chips 201 to 204 of FIG. 1.

According to some example embodiments, each of (or alternatively, at least one of) the storage blocks Block1 to Block8 may include a memory cell array and a peripheral circuit controlling the memory cell array. In an example of FIG. 2, each of (or alternatively, at least one of) the storage blocks Block1 to Block8 may include a memory cell array 221, a row decoder 222, a sense amplifier circuit 223, and a column decoder 224.

An operation of the memory chip 200 may be controlled by the logic circuit 210. The logic circuit 210 may store data received from the outside in at least one of the storage blocks Block1 to Block8, or may read data from at least one of the storage blocks Block1 to Block8 based on an address received from the outside, and may output the data externally.

The storage blocks Block1 to Block8 may each include a memory cell array and a peripheral circuit, and thus may operate in parallel. For example, to maximize parallel processing performance of the storage blocks Block1 to Block8, commands provided from the outside to the logic circuit 210 may be interleaved to be executed in parallel in each of (or alternatively, at least one of) the storage blocks Block1 to Block8. The storage blocks Block1 to Block8 that may operate in parallel may be referred to as a memory bank.

The logic circuit 210 may include an input/output pad 211, as described with reference to FIG. 1. In an example of FIG. 2, the storage blocks Block1 to Block8 may be arranged on one side of the logic circuit 210. Depending on physical distances between the storage blocks Block1 to Block8 and the input/output pad 211, different magnitudes of operating currents may be generated in each storage block.

According to some example embodiments, the logic circuit 210 may control to allocate block address codes to the storage blocks Block1 to Block8 in order of the physical distances between the storage blocks Block1 to Block8 and the input/output pad 211, and allocate the block address codes in a reverse order of the physical distances of the storage blocks Block1 to Block8 according to an addressing mode.

Although it is illustrated that the storage block corresponds to one memory bank in an example of FIG. 2, the present inventive concepts are not limited to a case in which the storage block is a memory bank. For example, a storage block may only include a plurality of rows of memory cells.

Figure 3:
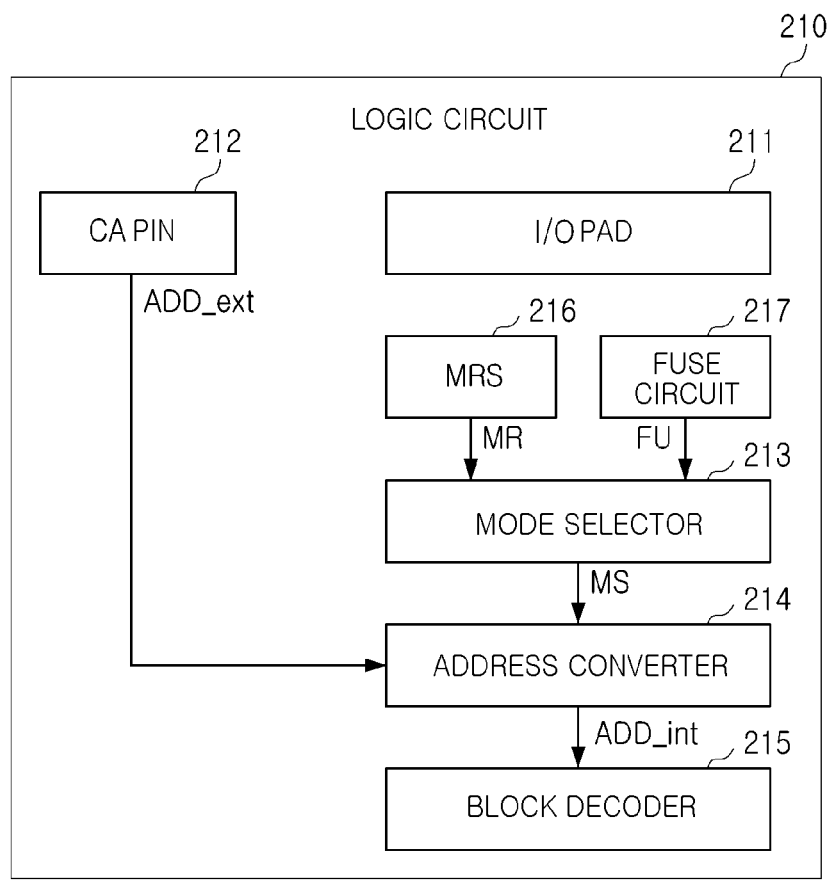
FIG. 3 is a block diagram illustrating in detail a logic circuit described with reference to FIG. 2.

FIG. 3 is a block diagram illustrating in detail a logic circuit described with reference to FIG. 2.

Referring to FIG. 3, a logic circuit 210 may include an input/output pad 211, a command/address pin 212, a mode selector 213, an address converter 214, a block decoder 215, a mode register set 216, and a fuse circuit 217. The logic circuit 210 and the input/output pad 211 of FIG. 3 may correspond to the logic circuit 210 and the input/output pad 211 described with reference to FIG. 2.

The command/address pin 212 may receive an external address code ADD_ext. For example, when a memory controller provides a common address code to a plurality of memory chips, the common address code may be the external address code ADD_ext.

The mode selector 213 may select an addressing mode of a memory chip 200. For example, the mode selector 213 may support a first addressing mode using a plurality of address codes allocated in order of operating current magnitudes of the plurality of storage blocks, and a second addressing mode in which the plurality of address codes are allocated in a reverse order of the operating current magnitudes of the plurality of storage blocks. According to some example embodiments, an operation mode of the mode selector 213 may be selected according to a mode register value MR from the mode register set (MRS) 216 and a fuse value FU from the fuse circuit 217.

The address converter 214 may convert the external address code ADD_ext received through the command/address pin 212 into an internal address code ADD_int. For example, the address converter 214 may output the external address code ADD_ext as an internal address code ADD_int as it is in the first addressing mode, and may output an address in which at least one bit of the external address code ADD_ext is inverted, as an internal address code ADD_int in the second addressing mode.

The block decoder 215 may select one of the storage blocks Block1 to Block8 by decoding the internal address code ADD_int output from the address converter 214.

The mode register set 216 may include a plurality of mode registers for setting various operation modes of the memory chip 200. One mode register among the plurality of mode registers may output a mode register value MR for selecting the addressing mode. The mode register value MR may be set in response to a command from a memory controller 100 described with reference to FIG. 1.

The fuse circuit 217 may include a fuse or an anti-fuse. For example, when the fuse circuit 217 includes a fuse, the fuse circuit 217 may output a fuse value FU having a predetermined or desired logic value in an initial state in which the fuse is short-circuited. The fuse may be opened by an external electrical stimulus, and when the fuse is opened, a fuse value FU having a logic value in which a predetermined or desired logic value is inverted may be output. When the fuse circuit 217 includes an anti-fuse, a fuse value FU may be inverted when the anti-fuse opened in an initial state is short-circuited by an external electrical stimulus.

FIGS. 4A and 4B are views illustrating a block address allocation method according to some example embodiments.

FIG. 4A is a view illustrating a method of allocating physical address codes to storage blocks according to physical distances between the storage blocks and an input/output pad.

In a table of FIG. 4A, storage blocks Block1 to Block8 included in a memory chip 200 may be arranged according to magnitudes of physical distances from the input/output pad. The storage blocks Block1 to Block8 may indicate blocks having physical distances from the input/output pad in order of a first storage block Block1 to an eighth storage block Block8.

According to some example embodiments, a storage block having a $k^{th}$ shortest distance from the input/output pad may be paired with a storage block having a $k^{th}$ longest distance from the input/output pad. In an example of FIG. 4A, the first storage block Block1 having the shortest physical distance may be paired with the eighth storage block Block8 having the longest physical distance. In addition, a second storage block Block2 having a second short physical distance may be paired with a seventh storage block Block1 having a second long physical distance. Similarly, a third storage block Block3 may be paired with a sixth storage block Block6, and a fourth storage block Block4 may be paired with a fifth storage block Block5.

Block address codes may be allocated to the storage blocks Block1 to Block8. For example, the storage blocks Block1 to Block8 and the block address codes may be mapped such that the block decoder 215 may select one storage block among the storage blocks Block1 to Block8 according to the block address codes.

For example, when the number of storage blocks included in the memory chip is $2^N$ (where N is a natural number), the block address code may be an N-bit code. In an example of FIG. 4A, 3-bit block address codes having different values may be mapped to 8 (=$2^3$) storage blocks.

According to some example embodiments, block address codes having a bit inversion relationship may be allocated to paired storage blocks. The block address codes having a bit inversion relationship may indicate that at least one bit of the block address codes have an inverted relationship with each other.

In an example of FIG. 4A, all bits may be inverted between the block address codes of the paired storage blocks. For example, when an address code '000' is allocated to the first storage block Block1 in a first addressing mode MODE1, an address code '111' in which all bits of the address code '000' are inverted may be allocated to the eighth storage block Block8, paired with the first storage block Block1. Similarly, address codes '001' and '110' may be allocated to the second storage block Block2 and the seventh storage block Block1, respectively, address codes '010' and '101' may be allocated to the third storage block Block3 and the sixth storage block Block6, respectively, and address codes '011' and '100' may be allocated to the fourth storage block Block4 and the fifth storage block Block5, respectively.

According to some example embodiments, the memory chip 200 may access a storage block using an external address code as it is in a first addressing mode MODE1, and may access a storage block using an address code having a bit inversion relationship with the external address code, in which at least some bits of the external address code is inverted, in a second addressing mode MODE2.

For example, when an external address code '000' is received by the memory chip 200, the memory chip 200 uses the external address code '000' as an internal address as it is in the first addressing mode MODE1, to access to the first storage block Block1. The memory chip 200 may generate an internal address code '111' in which all bits of the external address code '000' are inverted in the second addressing mode MODE2, to access to the eighth storage block Block8 indicated by the internal address code '111'. FIG. 4A illustrates external address codes corresponding to each of (or alternatively, at least one of) the storage blocks Block1 to Block8, when the memory chip 200 has the first addressing mode MODE1 and the second addressing mode MODE2.

As described with reference to FIG. 1, as distances between an input/output pad and a storage block among the storage blocks Block1 to Block8 increases, magnitudes of operating currents of the storage block may increase.

According to some example embodiments, some memory chips included in a memory system may operate in a first addressing mode MODE1, and remaining memory chips may operate in a second addressing mode MODE2. In response to a common address code from the outside, a storage block having a $k^{th}$ longest distance from the input/output pad may be accessed in some memory chips, and a storage block having a $k^{th}$ shortest distance from the input/output pad may be accessed in the remaining memory chips. According to some example embodiments, it is possible to prevent or hinder development of a situation in which only storage blocks having the highest operating current in memory chips included in the memory system are collectively accessed.

Some example embodiments in which block address codes are allocated to the storage blocks Block1 to Block8 according to distances between the storage blocks Block1 to Block8 and the input/output pad has been described with reference to FIG. 4A. However, the present inventive concepts are not limited thereto. For example, the block address code may be allocated according to measured values of operating currents of the storage blocks Block1 to Block8.

FIG. 4B is a view illustrating a block address allocation method according to magnitudes of operating currents of storage blocks.

In a table of FIG. 4B, storage blocks Block1 to Block8 included in a memory chip 200 may be arranged according to measured values of operating currents. For example, a first storage block Block1 may have the smallest measured value of the operating current as '90 mA,' and an eighth storage block Block8 may have the largest measured value of the operating current as '125 mA.'

According to some example embodiments, a storage block having a $k^{th}$ lowest operating current may be paired with a storage block having a $k^{th}$ highest operating current. In an example of FIG. 4B, a first storage block Block1 having the smallest measured value of an operating current may be paired with an eighth storage block Block8 having the largest measured value of an operating current. Similarly, a second storage block Block2 may be paired with a seventh storage block Block7, a third storage block Block3 may be paired with a sixth storage block Block6, and a fourth storage block Block4 may be paired with a fifth storage block Block5.

As described with reference to FIG. 4A, block address codes having a bit inversion relationship with each other may be allocated to the paired storage blocks. Then, the memory chip 200 may access a storage block using an external address code as it is in a first addressing mode MODE1, and may access a storage block using an address code having a bit inversion relationship with the external address code in a second addressing mode MODE2.

According to some example embodiments described with reference to FIGS. 4A and 4B, the memory chip 200 may pair storage blocks according to distances from an input/output pad or magnitudes of operating currents, and may allocate address codes having a bit inversion relationship to the paired storage blocks. According to some example embodiments, the memory chip 200 may use an external address code indicating to a $k^{th}$ storage block using a mode selector and an address converter having a simple circuit structure, to control that a storage block having a $k^{th}$ highest operating current is accessed and a storage block having a $k^{th}$ lowest operating current is accessed.

Figure 5A:
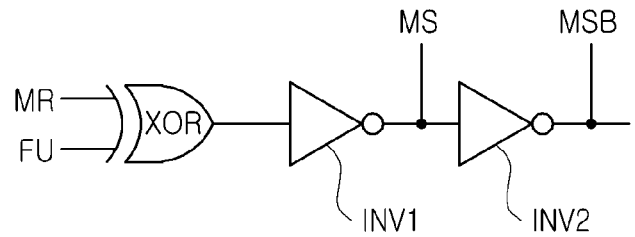
FIGS. 5A and 5B are circuit diagrams illustrating a mode selector described with reference to FIG. 3.
Figure 5B:
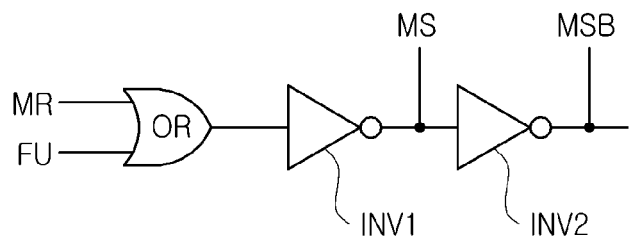

FIGS. 5A and 5B are circuit diagrams illustrating a mode selector described with reference to FIG. 3.

A mode selector 213a of FIG. 5A or a mode selector 213b of FIG. 5B may be applied to a mode selector 213, as described with reference to FIG. 3 according to some example embodiments.

Referring to FIG. 5A, the mode selector 213a may include an XOR gate and a plurality of inverters INV1 and INV2. The XOR gate may output a result of an XOR operation of a mode register value MR and a fuse value FU. A first inverter INV1 may be connected to an output terminal of the XOR gate, and may output a mode selection signal MS obtained by inverting the result of the XOR operation. In addition, a second inverter INV2 may be connected to an output terminal of the first inverter INV1, and may output a mode selection inversion signal MSB obtained by inverting the mode selection signal MS.

For example, in a factory shipment state of the memory chip 200, the mode register value MR and the fuse value FU may be set to '0.' When the mode register value MR and the fuse value FU are '0,' a result of an XOR operation may be '0.' When the result of the XOR operation is '0,' a value of the mode selection signal MS may be '1,' and a value of the mode selection inversion signal MSB may be '0.' When a value of the mode selection signal MS is '1,' a first addressing mode MODE1 may be selected.

Before a memory chip 200 exchanges data with a memory controller 100, the memory chip 200 may be initialized in response to control of the memory controller 100. When the memory chip 200 is initialized, the mode register value MR may be set to '0.' The memory controller 100 may provide a command to the memory chip 200 to set the mode register value MR as '1.'

For example, when the mode register value MR is set to be '1' and the fuse value FU is '0,' a result of an XOR operation may be changed to be '1.' When the result of the XOR operation is '1,' a value of the mode selection signal MS may be '0,' and a value of the mode selection inversion signal MSB may be '1.' When the value of the mode selection signal MS is '0,' a second addressing mode MODE2 may be selected. When the memory chip 200 is initialized again, the second addressing mode MODE2 may be initialized as the first addressing mode MODE1.

An electrical stimulus may be externally applied to the memory chip 200, an addressing mode in an initialization state of the memory chip 200 may be changed to the second addressing mode MODE2. For example, when an electrical stimulus is externally applied, a fuse of the fuse circuit 217 may be permanently opened, and the fuse value FU may be changed from '0' to '1.' When the fuse value FU is '1' and the mode register value MR is '0,' the result of the XOR operation may be '1' and the value of the mode selection signal MS may be '0.' Therefore, the addressing mode in the initialization state of the memory chip 200 may be set as the second addressing MODE2. When the mode register value MR is set as '1' and the fuse value FU is changed to be '1,' the addressing mode of the memory chip 200 may be changed from the second addressing mode MODE2 to the first addressing mode MODE1.

Referring to FIG. 5B, the mode selector 213b may include an OR gate and a plurality of inverters INV1 and INV2. The OR gate may output a result of an OR operation of a mode register value MR and a fuse value FU. A first inverter INV1 may be connected to an output terminal of the OR gate, and may output a mode selection signal MS obtained by inverting the result of the OR operation. In addition, a second inverter INV2 may be connected to an output terminal of the first inverter INV1, and may output a mode selection inversion signal MSB obtained by inverting the mode selection signal MS.

A difference between the mode selector 213a of FIG. 5A and the mode selector 213b of FIG. 5B will be briefly described. In the mode selector 213b of FIG. 5B, when a fuse of the fuse circuit 217 is opened, the fuse value FU may be changed to be '1.' When the fuse value FU is changed to be '1,' a value of the mode selection signal MS may be fixed to be '1' regardless of whether the mode register value MR is '0' or '1.' As a result, an addressing mode of the memory chip 200 may be fixed as the second addressing mode MODE2.

Figure 6:
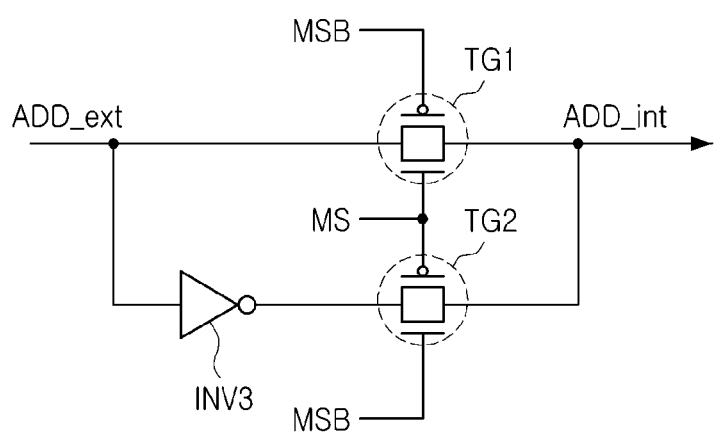
FIG. 6 is a circuit diagram illustrating an address converter described with reference to FIG. 3.

FIG. 6 is a circuit diagram illustrating an address converter described with reference to FIG. 3.

Referring to FIG. 6, when a value of a mode selection signal MS is '1,' an address converter 214 may operate in a first addressing mode MODE1, and when a value of a mode selection signal MS is '0,' the address converter 214 may operate in a second addressing mode MODE2.

Specifically, the address converter 214 may include a third inverter INV3 and a plurality of transmission gates TG1 and TG2. An external address code ADD_ext received from a command/address CA pin 212 may be branched at an input terminal of the address converter 214. The branched external address code ADD_ext may be input as it is to a first transmission gate TG1. In addition, the branched external address code ADD_ext may be inverted by the third inverter INV3, and may then input to a second transmission gate TG2.

The transmission gates TG1 and TG2 may function as a multiplexer outputting one of an external address code ADD_ext or an address having a bit inversion relationship with the external address as an internal address code ADD_int, based on a mode selection signal MS and a mode selection inversion signal MSB.

For example, when a value of the mode selection signal MS is '1' and a value of the mode selection inversion signal MSB is '0,' the first transmission gate TG1 may be turned on and the second transmission gate TG2 may be turned off, to output the external address code ADD_ext as an internal address code ADD_int. For example, when the value of the mode selection signal MS is '1,' a memory chip 200 may operate in a first addressing mode MODE1 in which the external address code ADD_ext is used as the internal address code ADD_int as it is.

When a value of the mode selection signal MS is '0' and a value of the mode selection inversion signal MSB is '1,' the first transmission gate TG1 may be turned off and the second transmission gate TG2 may be turned on, to output the address having a bit inversion relationship with the external address code ADD_ext as an internal address code ADD_int. For example, when the value of the mode selection signal MS is '0,' the memory chip 200 may operate in a second addressing mode MODE2 in which the address having a bit inversion relationship with the external address code ADD_ext is used as the internal address code ADD_int.

According to some example embodiments, a memory system 10 may control a mode register value MR and a fuse value FU of memory chips such that the plurality of memory chips have a first addressing mode MODE1 or a second addressing mode MODE2. When some memory chips, among the plurality of memory chips, have the first addressing mode MODE1 and remaining memory chips have the second addressing mode MODE2, access to a storage block having a maximum or high operating current may be prevented or hindered in all of the memory chips.

Figure 7A:
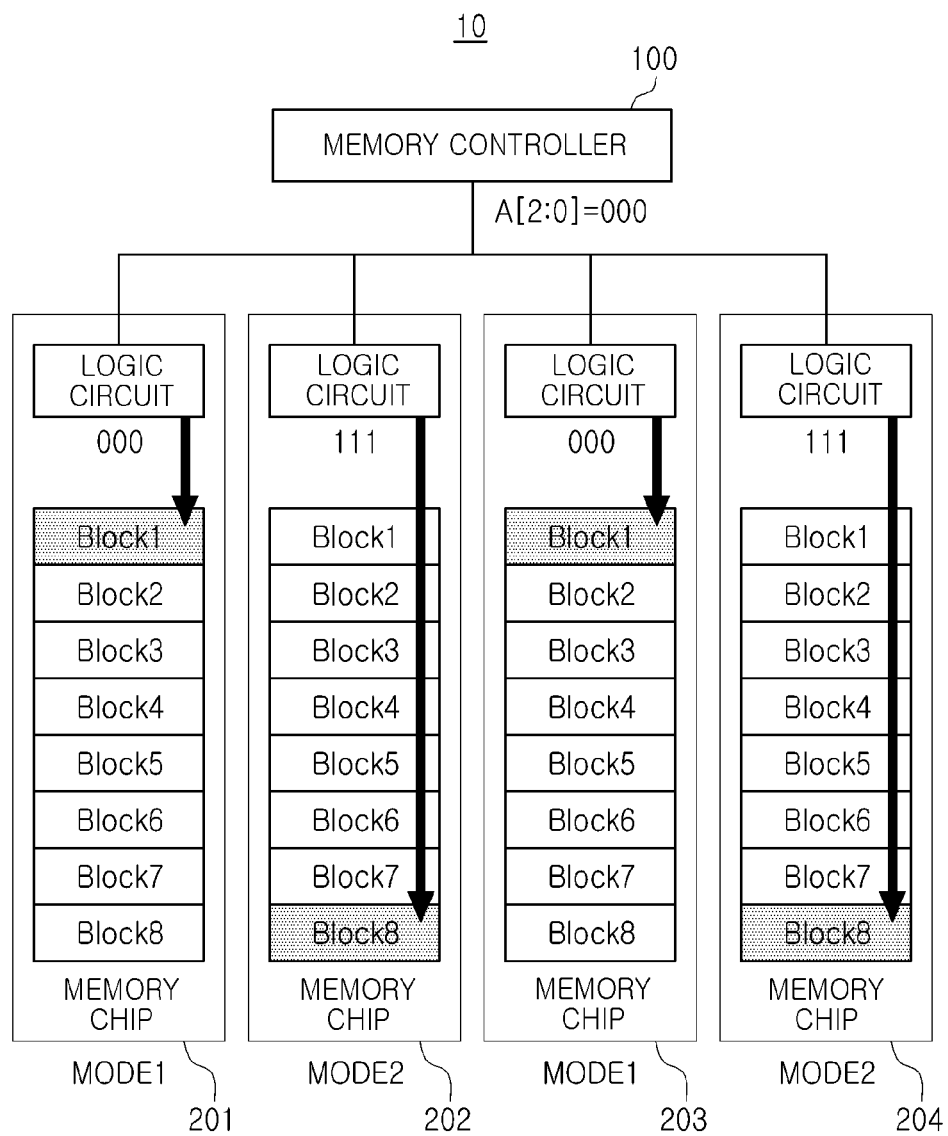
FIGS. 7A and 7B are views illustrating an operation of a memory system according to some example embodiments.
Figure 7B:
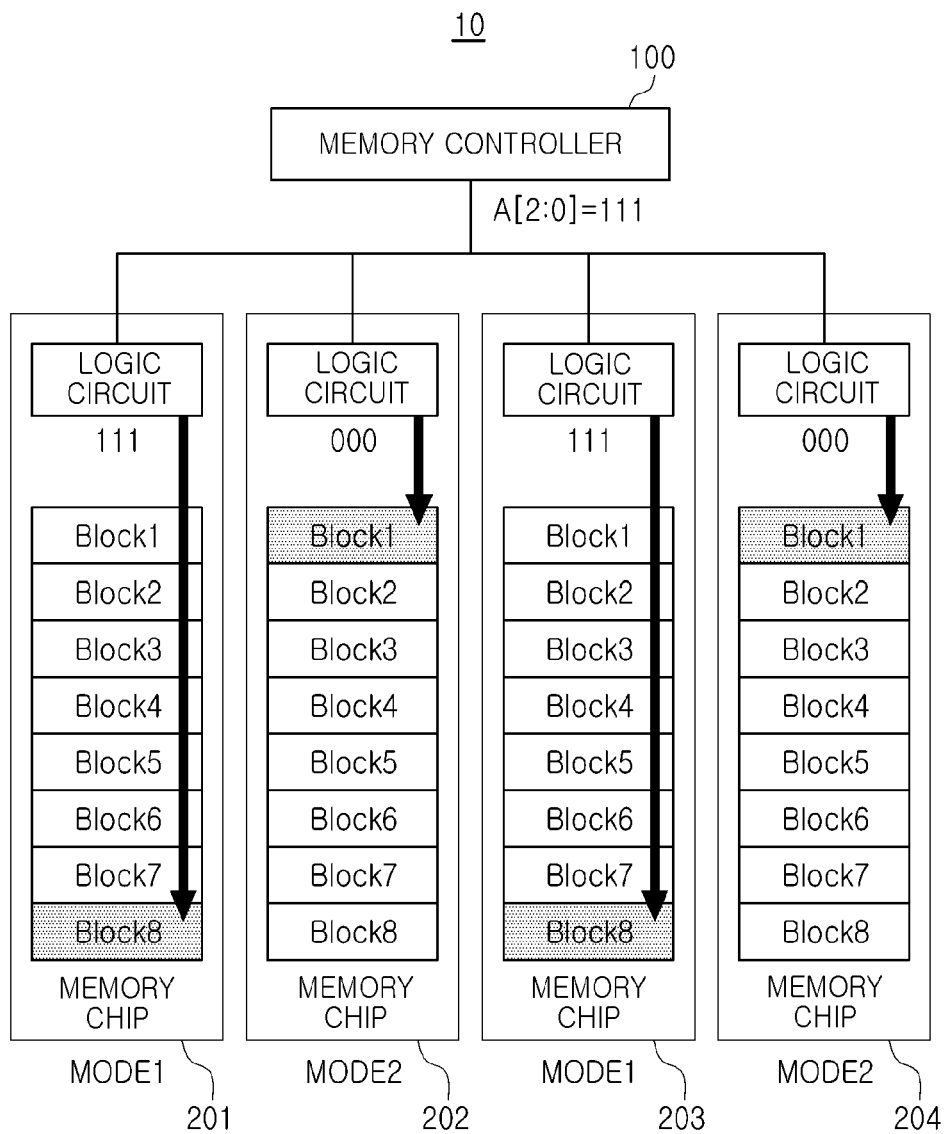

FIGS. 7A and 7B are views illustrating an operation of a memory system according to some example embodiments.

As described with reference to FIG. 1, a memory system 10 may include a memory controller 100 and a plurality of memory chips 201 to 204. The plurality of memory chips 201 to 204 may constitute a memory rank. The plurality of memory chips 201 to 204 included in the memory rank may parallelly operate in response to an access command and a common address code.

In an example of FIGS. 7A and 7B, block address codes, as described with reference to FIG. 4A, may be allocated to storage blocks Block1 to Block8 of the plurality of memory chips 201 to 204. In addition, among the plurality of memory chips 201 to 204, a first addressing mode MODE1 may be selected in the memory chips 201 and 203, and a second addressing mode MODE2 may be selected in the memory chips 202 and 204.

Referring to FIG. 7A, the memory controller 100 may provide a common address code '000' to the plurality of memory chips 201 to 204 (A[2:0]=000). In the memory chips 201 and 203 operating in the first addressing mode MODE1, a logic circuit may access a first storage block Block1 using the common address code '000' as it is as an internal address code '000'.

In the memory chips 202 and 204 operating in the second addressing mode MODE2, the logic circuit may generate an internal address code '111' having a bit inversion relationship with the common address code '000,' and may use the internal address code '111' to access an eighth storage block Block8.

Referring to FIG. 7B, the memory controller 100 may provide a common address code '111' to the plurality of memory chips 201 to 204, differently from FIG. 7A (A[2:0]=111).

In the memory chips 201 and 203 operating in the first addressing mode MODE1, a logic circuit may access an eighth storage block Block8 using the common address code '111' as it is. In the memory chips 202 and 204 operating in the second addressing mode MODE2, the logic circuit may generate an internal address code '000' having a bit inversion relationship with the common address code '111,' and may use the internal address code '000' to access a first storage block Block1.

Referring to FIGS. 7A and 7B, when an eighth storage block Block8 having the highest operating current is accessed in some memory chips, among the plurality of memory chips 201 to 204, a first storage block Block1 having the lowest operating current may be accessed together in other memory chips. Therefore, a magnitude of a peak current of the memory system 10 may be reduced.

Figure 8A:
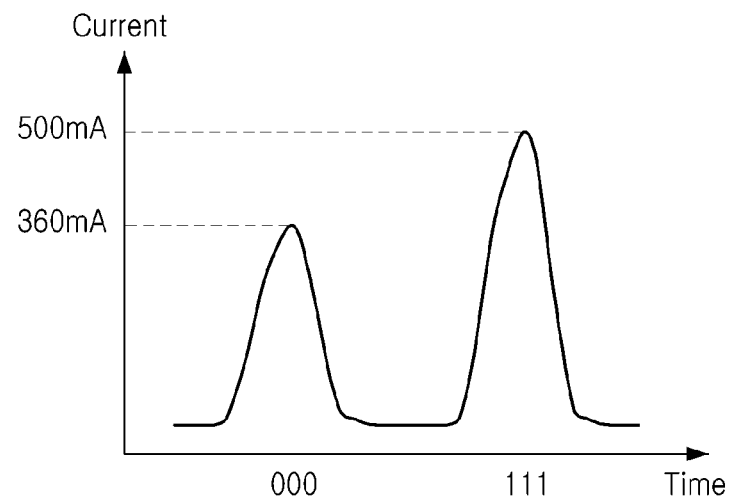
FIGS. 8A and 8B are views illustrating an effect of reducing a peak current according to an embodiment.
Figure 8B:
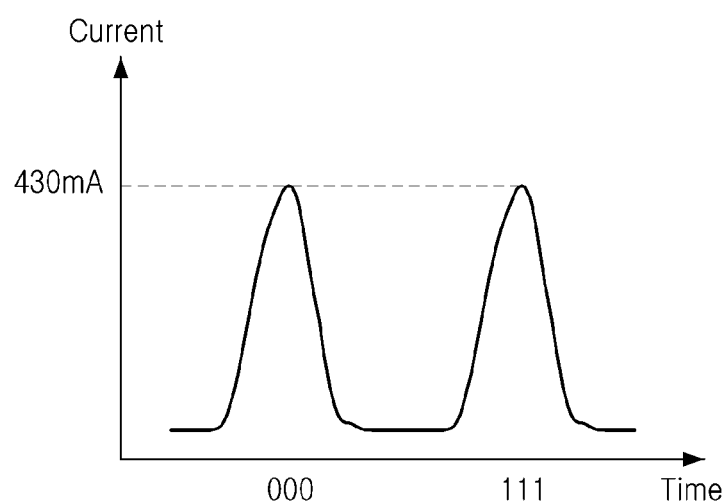

FIGS. 8A and 8B are views illustrating an effect of reducing a peak current according to some example embodiments.

FIG. 8A illustrates an operating current of a memory system 10 according to some other example embodiments, and FIG. 8B illustrates an operating current of a memory system 10 according to some example embodiments.

In the other example embodiments of FIG. 8A, in a case in which the memory system includes four memory chips, when a common address code '000' is input to the memory chips, a first storage block Block1 may be collectively selected from the memory chips, and when a common address code '111' is input to the memory chips, an eighth storage block Block8 may be collectively selected from the memory chips.

As illustrated in FIG. 4B, in a case in which an operating current of the first storage block Block1 is 90 mA and an operating current of the eighth storage block Block8 is 125 mA, when a common address code '000' is input to the memory chips, a peak current of 360 mA may occur in the memory system, and when a common address code '111' is input to the memory chips, a peak current of 500 mA may occur in the memory system. For example, in the other example embodiments of FIG. 8A, a peak current of up to 500 mA may be occurred.

Referring to FIGS. 7A and 8B together, when a common address code '000' is input to a plurality of memory chips 201 to 204 of a memory system 10 according to some example embodiments, a first storage block Block1 may be selected in two memory chips 201 and 203, and an eighth storage block Block8 may be selected in two memory chips 202 and 204. For example, when a common address code '000' is input, a peak current of 430 mA (=90 mA×2+125 mA×2) may be occurred in the memory system 10.

Referring to FIGS. 7B and 8B together, when a common address code '111' is input, an eighth storage block Block8 may be selected in two memory chips 201 and 203, and a first storage block Block1 may be selected in two memory chips 202 and 204. For example, when a common address code '111' is input, a peak current of 430 mA (=125 mA×2+90 mA×2) may be occurred in the memory system 10. In an example of FIG. 8B, a peak current of up to 430 mA may be occurred in the memory system 10.

Comparing FIGS. 8A and 8B, a maximum or high peak current of a memory system 10 according to some example embodiments may be reduced by about 70 mA, compared to a maximum or high peak current of a memory system according to some other example embodiments. As a result, according to some example embodiments, the maximum or high peak current of the memory system 10 may be reduced, and EMI and jitter may be reduced. Therefore, performance and reliability of the memory system 10 may be improved.

Some example embodiments in which all bits of block address codes of paired storage blocks are inverted has been mainly described, as in FIGS. 1 to 8B. However, the present inventive concepts are not limited thereto. According to some example embodiments, only some bits of block address codes of paired storage blocks may be inverted.

FIG. 9 is a view illustrating a block address allocation method according to some example embodiments.

FIG. 9 illustrates a block address allocation method according to some example embodiments by taking as an example a case in which only one bit among bits of block address codes of paired storage blocks is inverted.

Referring to FIG. 9, as described with reference to FIGS. 4A to 4B, a first storage block Block1 and an eighth storage block Block8 may be paired, a second storage block Block2 and a seventh storage block Block7 may be paired, a third storage block Block3 and a sixth storage block Block6 may be paired, and a fourth storage block Block4 and a fifth storage block Block5 may be paired.

FIG. 9 illustrates cases in which address codes of paired storage blocks are inverted with only one bit out of 3 bits (A[2:0]) including the address codes. For example, referring to a case in which only a A[0] bit, which is the last bit, is inverted, when a block address code '000' is allocated to the first storage block Block1, a block address code '001' in which only the A[0] bit is inverted may be allocated to the eighth storage block Block8. Similarly, address codes '010' and '011' may be allocated to the second storage block Block2 and the seventh storage block Block7, respectively, address codes '100' and '101' may be allocated to the third storage block Block3 and the sixth storage block Block6, respectively, and address codes '111' and '110' may be allocated to the fourth storage block Block4 and the fifth storage block Block5, respectively.

According to some example embodiments, when only A[0] bits in address codes of paired storage blocks are inverted, an address code obtained by inverting only an A[0] bit of an external address code in a second addressing mode MODE2 may be used to access a storage block. For example, when an external address '000' is received by a memory chip 200, the memory chip 200 may generate an internal address '001' obtained by inverting an A[0] bit of the external address '000' in the second addressing mode MODE2, and may access to the eighth storage block Block8 indicated by the internal address '001.'

FIG. 9 illustrates a storage block accessed according to an external address code when the memory chip 200 has a first addressing mode MODE1 and a second addressing mode MODE2. When only an A[0] bit is inverted, a plurality of address codes may be allocated in order of '000,' '010,' '100,' '110,' '111,' '101,' '011,' and '001,' according to order of operating current magnitudes of a plurality of storage blocks Block1 to Block8.

The memory chip 200 may access the storage block using the plurality of address codes allocated according to the order of the operating currents of the plurality of storage blocks Block1 to Block8 in the first addressing mode MODE1. The memory chip 200 may access the storage block according to the second addressing mode MODE2 in which the plurality of address codes are allocated in a reverse order of the operation current magnitudes of the plurality of storage blocks.

Even when, in the block address codes, only an A[1] bit is inverted and only an A[2] bit is inverted, the block address codes may be allocated in a reverse order in the first addressing mode MODE1 and the second addressing mode MODE2.

When only some bits, among bits of the block address codes, are inverted, only some bits of an address input to a second transmission gate TG2, as described with reference to FIG. 6, may be inverted by a third inverter INV3, and remaining bits may bypass the third inverter INV3.

In the examples of FIGS. 1 to 9, some example embodiments in which a plurality of storage blocks Block1 to Block8 in a memory chip 200 are arranged in a line on one side of a logic circuit 210 will be mainly described. However, the present inventive concepts are not limited thereto. In a memory chip according to some example embodiments, a plurality of storage blocks Block1 to Block8 may be arranged in various patterns.

Figure 10:
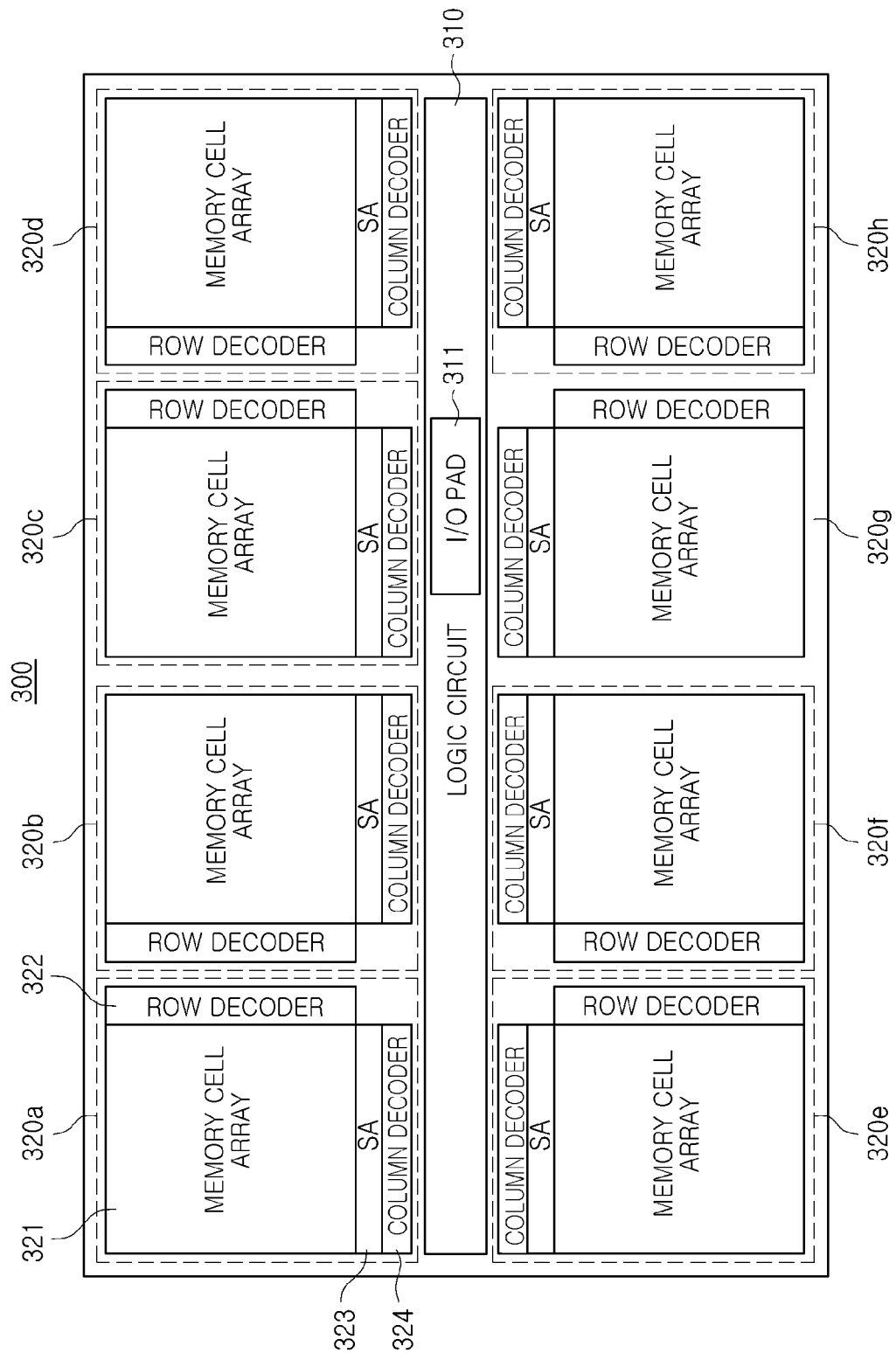
FIG. 10 is a block diagram illustrating a memory chip according to some example embodiments.

FIG. 10 is a block diagram illustrating a memory chip according to some example embodiments.

Referring to FIG. 10, a memory chip 300 may include a logic circuit 310 and a plurality of storage blocks 320a to 320h. Like storage blocks Block1 to Block8 described with reference to FIG. 2, the plurality of storage blocks 320a to 320h may include a memory cell array 321, a row decoder 322, a sense amplifier circuit 323, and a column decoder 324, respectively.

In an example of FIG. 10, the logic circuit 310 may be disposed in a central region of the memory chip 300. In addition, the plurality of storage blocks 320a to 320h may be disposed on both sides (e.g., opposing sides) of the logic circuit 310. The logic circuit 310 may include an input/output (I/O) pad 311, similarly to that described with reference to FIG. 2.

Even when the plurality of storage blocks 320a to 320h are not arranged in a line with each other, the plurality of storage blocks 320a to 320h may be paired according to a physical distance from the input/output pad 311 or a relative magnitude of operating currents of the plurality of storage blocks 320a to 320h, and address codes having a bit inversion relationship between the paired storage blocks may be allocated.

For example, storage blocks 320c and 320g may be storage blocks having the shortest distance from the input/output pad 311, and storage blocks 320a and 320e may be the storage blocks having the longest distance from the input/output pad 311. Block address codes having a bit inversion relationship may be allocated to the storage blocks 320c and 320g and the storage blocks 320a and 320e. In this case, the logic circuit 310 may pair the storage block 320c and the storage block 320a, may pair the storage block 320g and the storage block 320e, and address codes having a bit inversion relationship between the paired storage blocks with each other may be allocated.

Memory chips included in a memory system may include a memory device such as at least one memory module, at least one memory package, or the like. According to some example embodiments, the memory system may set an addressing mode of the memory chips included in the memory device, to reduce a magnitude of a maximum or high peak current of the memory device, and improve a current density of the memory device.

Figure 11:
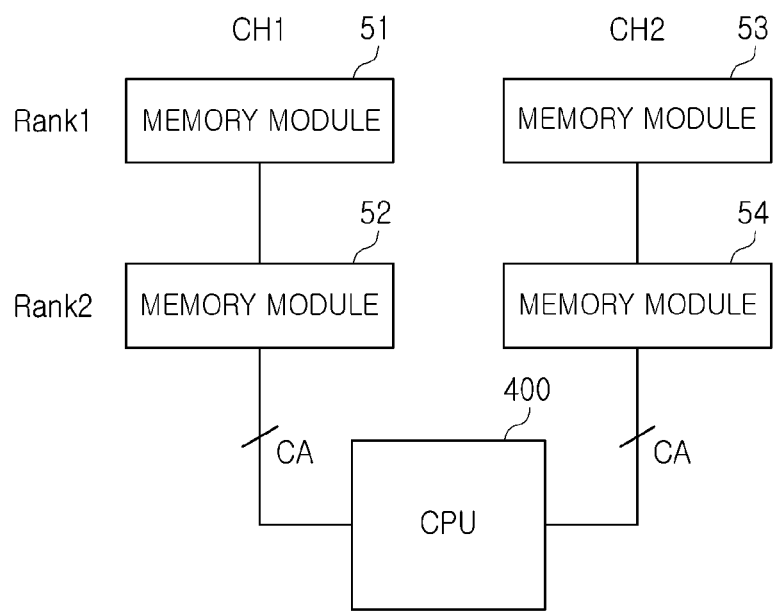
FIGS. 11 to 12 are views illustrating a memory system according to some example embodiments.
Figure 12:
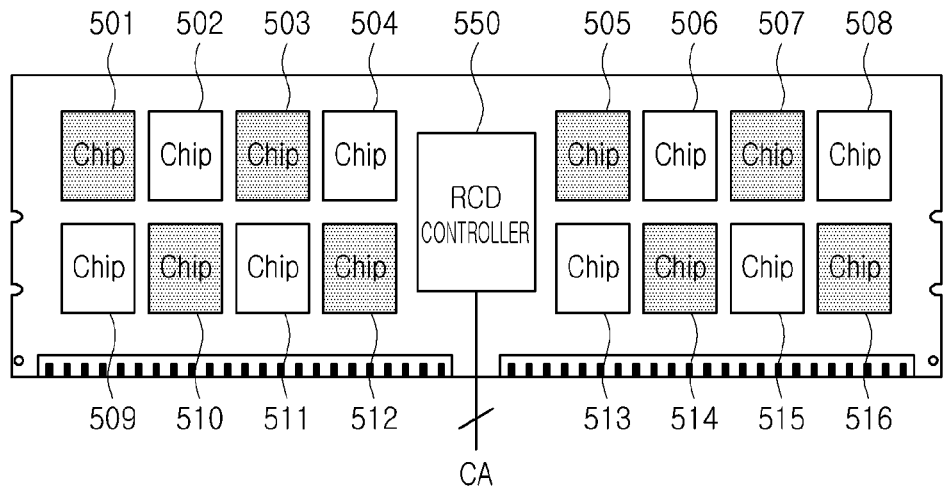

FIGS. 11 to 12 are views illustrating a memory system according to some example embodiments.

Referring to FIG. 11, a memory system 40 may include a CPU 400 and a plurality of memory modules 51 to 54. The CPU 400 may include a memory controller for controlling the plurality of memory modules 51 to 54.

Each of (or alternatively, at least one of) the plurality of memory modules 51 to 54 may include a plurality of memory chips. A plurality of memory chips included in one memory module may simultaneously input or output data through a data bus. For example, one memory module may include a memory rank. For example, each of (or alternatively, at least one of) the plurality of memory modules 51 to 54 may be a dual in-line memory module (DIMM).

The plurality of memory modules 51 to 54 may be connected to at least one channel. For example, memory modules 51 and 52 may be connected to a first channel CH1, and memory modules 53 and 54 may be connected to a second channel CH2.

The CPU 400 may separately include a command/address bus for the first channel CH1 and a command/address bus for the second channel CH2, to simultaneously control a memory module connected to the first channel CH1 and a memory module connected to the second channel CH2. Memory modules included in one channel may be sequentially controlled through one command/address bus.

Referring to FIG. 12, a memory module 50 may include an RCD controller 550 and a plurality of memory chips 501 to 516. The memory module 50 of FIG. 12 may correspond to any of the memory modules 51 to 54 of FIG. 11.

The plurality of memory chips 501 to 516 may correspond to the memory chips described with reference to FIGS. 1 to 10. For example, each of (or alternatively, at least one of) the plurality of memory chips 501 to 516 may include a plurality of storage blocks, and may support a first addressing mode MODE1 and a second addressing mode MODE2 according to a magnitude order of operating currents of the plurality of storage blocks or a physical distance from an input/output pad. In the first addressing mode MODE1 and the second addressing mode MODE2, block address codes may be allocated in a reverse order.

The RCD controller 550 may control the plurality of memory chips 501 to 516. For example, a command/address signal received from the CPU 400 may be buffered, and the buffered command/address signal may be provided to the plurality of memory chips 501 to 516.

According to some example embodiments, the CPU 400 may determine an addressing mode of each of (or alternatively, at least one of) the plurality of memory chips 501 to 516 included in the memory module 50, to reduce a magnitude of a maximum or high peak current of the memory module 50. For example, the CPU 400 may determine an addressing mode of some memory chips, among the plurality of memory chips 501 to 516, as the first addressing mode MODE1, and may determine an addressing mode of remaining memory chips as the second addressing mode MODE2, to prevent or hinder access to operation blocks having a relatively high operation current in the plurality of memory chips 501 to 516.

According to some example embodiments, the CPU 400 may determine an addressing mode of memory chips 501 to 516 such that the number of memory chips determined as the first addressing mode MODE1 is equal to the number of memory chips determined as the second addressing mode MODE2.

Also, the CPU 400 may determine an addressing mode of the memory chips 501 to 516 to have different addressing modes between physically adjacent memory chips in the memory module 50. In an example of FIG. 12, when a memory chip 503 has the first addressing mode MODE1, memory chips 502, 504, and 511, adjacent to the memory chip 503, may be controlled to have the second addressing mode MODE2. When physically adjacent memory chips have different addressing modes, a maximum or high peak current of the memory module 50 may be reduced, and a current density at each position of the memory module 50 may be uniform. Therefore, it is possible to prevent or hinder intensive generation of EMI, jitter, heat, or the like at a specific location of the memory module 50.

The CPU 400 may provide a command for controlling the mode register value of each of (or alternatively, at least one of) the memory chips 501 to 516 to the memory module 50, to determine addressing modes of the memory chips 501 to 516. In addition, a manufacturer, a user, or the like of the memory module 50 may apply an electrical stimulus to the memory module 50, to change a fuse value of the memory chips 501 to 516, and change an addressing mode of the memory chips 501 to 516.

Figure 13:
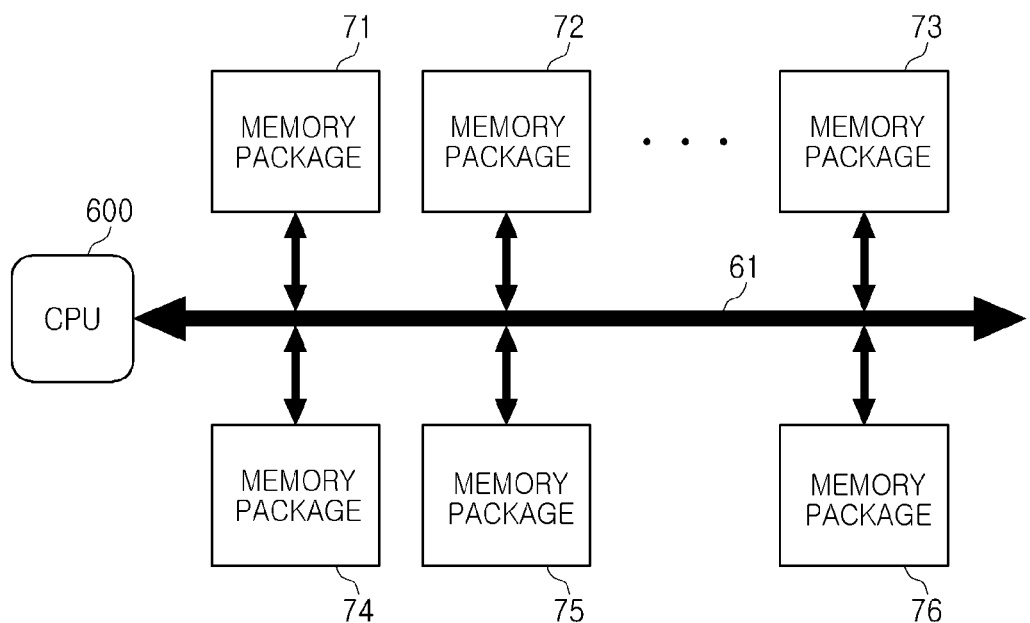
FIGS. 13 to 14 are views illustrating a memory system according to some example embodiments.
Figure 14:
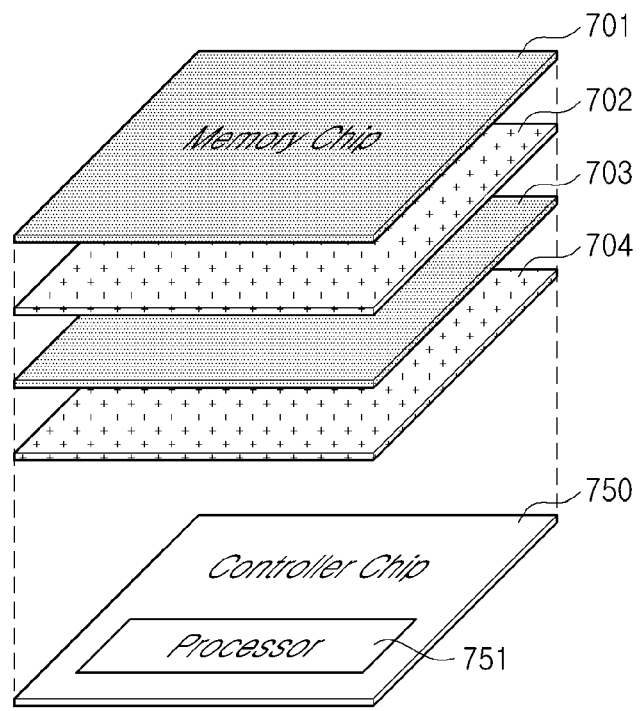
Figure 14:
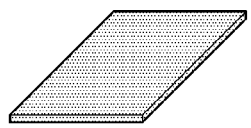
Figure 14:
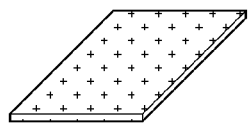

FIGS. 13 to 14 are views illustrating a memory system according to some example embodiments.

Referring to FIG. 13, a memory system 60 may include a CPU 600 and a plurality of memory packages 71 to 76. The CPU 600 may include a memory controller for controlling the plurality of memory packages 71 to 76.

Each of (or alternatively, at least one of) the plurality of memory packages 71 to 76 may include a stack memory device. The plurality of memory packages 71 to 76 may be connected to the CPU 600 through a bus 61. Each of (or alternatively, at least one of) the plurality of memory packages 71 to 76 may be connected to at least one channel.

Referring to FIG. 14, a memory package 70 may include a plurality of memory chips 701 to 704 and a controller chip 750. The memory package 70 may correspond to any of the memory packages 71 to 76 of FIG. 13. The controller chip 750 may include a processor 751 sequentially provide consecutive commands to the memory banks to interleave the consecutive commands. The processor 751 may cause the controller chip 750 to perform operations.

The plurality of memory chips 701 to 704 may correspond to the memory chip described with reference to FIGS. 1 to 10. The plurality of memory chips 701 to 704 may be stacked on the controller chip 750.

The controller chip 750 may control the plurality of memory chips 701 to 704. For example, the controller chip 750 may transmit a command/address signal received from a CPU 600, to the plurality of memory chips 701 to 704, and may exchange data with the plurality of memory chips 701 to 704. The controller chip 750 and the memory chips 701 to 704 may be connected by wire bonding, a through-silicon-via (TSV), or the like.

According to some example embodiments, the CPU 600 may determine an addressing mode of each of (or alternatively, at least one of) the plurality of memory chips 701 to 704 included in the memory package 70, to reduce a magnitude of a maximum or high peak current of the memory package 70.

Similar to that described with reference to FIG. 12, the CPU 600 may determine an addressing mode of each of (or alternatively, at least one of) the plurality of memory chips 701 to 704 to have different addressing modes between physically adjacent memory chips, to have even current densities at each location of the memory package 70. In an example of FIG. 14, when a memory chip 703 has the first addressing mode MODE1, memory chips 702 and 704, physically adjacent to the memory chip 703, may be determined to have the second addressing mode MODE2.

According to some example embodiments described with reference to FIGS. 1 to 14, a memory system may reduce a maximum magnitude of a peak current by avoiding a situation in which storage blocks having relatively high operating currents are simultaneously selected in the plurality of memory chips. Therefore, performance and reliability of the memory system may be improved.

A memory chip according to some example embodiments may include and further provide an addressing mode allocating block address codes according to order of distances of a plurality of storage blocks from input/output pads or order of operating current magnitudes of the plurality of storage blocks, and in which the block address codes are allocated in reverse orders of the orders using an address converter and a mode selector having a simple circuit structure.

In a memory system according to some example embodiments, storage blocks having different operating current magnitudes may be selected in a plurality of memory chips, when a common address code is applied to the plurality of memory chips by selecting different addressing modes in the plurality of memory chips. The memory system may reduce a maximum magnitude of a peak current by avoiding a situation in which storage blocks having relatively high operating current magnitudes are simultaneously selected.

Any of the elements and/or functional blocks disclosed above may include or be implemented in processing circuitry such as hardware including logic circuits; a hardware/software combination such as a processor executing software; or a combination thereof. For example, the memory controller 100, logic circuit 210, RCD controller, and processor 751 be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

Problems and challenges to be solved by the present inventive concepts are not limited to the problems and challenges mentioned above, and other problems or challenges not mentioned will be clearly understood by those skilled in the art from the following description.

While some example embodiments have been shown and described above, it will be apparent to those skilled in the art that modifications and variations could be made without departing from the scope of the present inventive concepts as defined by the appended claims.

What is claimed is:
1. A memory chip comprising:
a plurality of storage blocks respectively including a plurality of memory cells; and
a logic circuit configured to control the plurality of storage blocks,
wherein the logic circuit includes
an input/output pad configured to input data to the plurality of storage blocks and output data to the plurality of storage blocks, wherein the logic circuit is further configured to
allocate block address codes having a bit inversion relationship with each other, to a storage block having a $k^{th}$ longest distance from the input/output pad among the plurality of storage blocks and a storage block having a $k^{th}$ shortest distance from the input/output pad among the plurality of storage blocks, where k is a natural number, among the plurality of storage blocks, output a mode selection signal in response to external control, output an external address code received together with an access command in response to the mode selection signal indicating a first addressing mode, and output a first address code having the bit inversion relationship with regard to the external address code in response to the mode selection signal indicating a second addressing mode, and select a first storage block to be controlled by the access command from among the plurality of storage blocks, based on the external address code or the first address code.

2. The memory chip of claim 1, wherein the bit inversion relationship is a relationship in which at least one bit of each of the block address codes is inverted.

3. The memory chip of claim 2, wherein a number of storage blocks in the plurality of storage blocks is $2^N$, where N is a natural number, each of the block address codes is an N-bit code, and the logic circuit is configured to allocate a block address code having a larger code value to a storage block among the plurality of storage blocks, as a distance between the storage block and the input/output pad increases.

4. The memory chip of claim 1, wherein the logic circuit further comprises a mode register and a fuse circuit, the mode register including a value, the mode register configured to set the value in response to the external control, and the logic circuit is configured to output the mode selection signal, based on an XOR operation result of a value of the mode register and an output value of the fuse circuit.

5. The memory chip of claim 4, wherein the logic circuit is configured to output the mode selection signal, based on an OR operation result of the value of the mode register and the output value of the fuse circuit.

6. The memory chip of claim 1, wherein the plurality of storage blocks are arranged in a line on a side of the input/output pad.

7. The memory chip of claim 1, wherein the plurality of storage blocks are arranged on opposing sides of the input/output pad.

8. The memory chip of claim 1, wherein each of the plurality of storage blocks comprises:

a row decoder configured to select a row address of the plurality of memory cells; and a column decoder configured to select a column address of the plurality of memory cells, wherein each of the plurality of storage blocks is configured to perform respective access operations in parallel.

* * * * *